(12) United States Patent
Jin (10) Patent No.: US 7,453,108 B2
(45) Date of Patent: Nov. 18, 2008

(54) SEMICONDUCTOR DEVICE THAT IS ADVANTAGEOUS IN COMPLEX STRESS ENGINEERING AND METHOD OF MANUFACTURING THE SAME

(75) Inventor: Zhengwu Jin, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 11/654,020

(22) Filed: Jan. 17, 2007

(65) Prior Publication Data

US 2007/0262391 A1    Nov. 15, 2007

(30) Foreign Application Priority Data

May 9, 2006    (JP) .............................. 2006-130338

(51) Int. Cl.
*H01L 31/062* (2006.01)
(52) U.S. Cl. .................. 257/288; 257/194; 257/18; 257/E27.006
(58) Field of Classification Search .............. 257/288, 257/E27.006
See application file for complete search history.

(56) References Cited

U.S. PATENT DOCUMENTS

2006/0237711 A1 * 10/2006 Teraguchi ..................... 257/14

FOREIGN PATENT DOCUMENTS

JP    06-232170 A    8/1994

OTHER PUBLICATIONS

Xiaobing Ren, "Large electric-field-induced strain in ferroelectric crystals by point-defect-mediated reversible domain switching", Nature Materials, vol. 3, Feb. 2004, 15 pages.

* cited by examiner

*Primary Examiner*—Tu-Tu V Ho
(74) *Attorney, Agent, or Firm*—Foley & Lardner LLP (57)    ABSTRACT

A semiconductor device according to an embodiment includes an insulated-gate field-effect transistor including a gate insulation film provided on a major surface of a semiconductor substrate, a gate electrode provided on the gate insulation film, and a source and a drain provided spaced apart in the semiconductor substrate such that the gate electrode is interposed between the source and the drain, a first contact wiring line which is provided on the source, a second contact wiring line which is provided on the drain, and a piezoelectric layer which is provided to cover the gate electrode and has one end and the other end connected between the first and second contact wiring lines.

17 Claims, 11 Drawing Sheets

Piezoelectric layer 22 (before application of voltage)

Drain potential (Vdd) side ← → Source potential (Vss) side

SEMICONDUCTOR DEVICE THAT IS ADVANTAGEOUS IN COMPLEX STRESS ENGINEERING AND METHOD OF MANUFACTURING THE SAME

CROSS-REFERENCE TO RELATED APPLICATIONS

This application is based upon and claims the benefit of priority from prior Japanese Patent Application No. 2006-130338, filed May 9, 2006, the entire contents of which are incorporated herein by reference.

BACKGROUND OF THE INVENTION

1. Field of the Invention

The present invention relates to a semiconductor device and a method of manufacturing the semiconductor device, and is applied, for example, to a MOS (metal-oxide semiconductor) transistor, in which the mobility of carriers is varied by applying a stress to a channel region, and a method of manufacturing the same.

2. Description of the Related Art

It is conventionally known that if a stress is applied to a channel region of Si (silicon) or SiGe (silicon germanium), the mobility of carriers varies. If a compressive stress is applied to the channel region, the mobility of holes increases. On the other hand, if a tensile stress is applied to the channel region, the mobility of electrons increases. In order to take advantage of this phenomenon and to produce a desired stress, various attempts have been made. For example, process conditions are altered, or dimensions of structural parts of the device are altered (see, e.g. Jpn. Pat. Appln. KOKAI Publication No. 6-232170). Typical examples of the semiconductor device using this phenomenon are as follows.

1. A semiconductor device including an $Si_3N_4$ (silicon nitride) film as a liner insulation film, the thickness of the $Si_3N_4$ film being varied to control the magnitude of stress.

In this structure, the value of stress that is to be applied varies due to non-uniformity in thickness of the $Si_3N_4$ film that is deposited, and the controllability of stress deteriorates. In the case of applying this technique to both PMOS and NMOS transistors, it is necessary to form different $Si_3N_4$ films for applying a compressive stress and a tensile stress. This requires provision of an expensive manufacturing apparatus, leading to an increase in manufacturing cost.

2. A semiconductor device to which a so-called strain Si substrate is applied.

In this structure, crystal defects tend to easily occur in the strained Si of the channel region, and thus a junction leak tends to easily occur. The strained Si substrate is fabricated by successively and epitaxially growing a stacked structure of an Si buffer layer/SiGe layer/stained Si layer on an Si substrate. Consequently, the number of fabrication steps increases, and a manufacturing cost becomes much higher than in the case of ordinary Si substrates.

BRIEF SUMMARY OF THE INVENTION

According to an aspect of the present invention, there is provided a semiconductor device comprising an insulated-gate field-effect transistor including a gate insulation film provided on a major surface of a semiconductor substrate, a gate electrode provided on the gate insulation film, and a source and a drain provided spaced apart in the semiconductor substrate such that the gate electrode is interposed between the source and the drain, a first contact wiring line which is provided on the source, a second contact wiring line which is provided on the drain, and a piezoelectric layer which is provided to cover the gate electrode and has one end and the other end connected between the first and second contact wiring lines.

According to another aspect of the present invention, there is provided a semiconductor device comprising, a first insulated-gate field-effect transistor of a first conductivity type including a gate insulation film provided on a major surface of a semiconductor substrate, a gate electrode provided on the gate insulation film, and a source and a drain provided spaced apart in the semiconductor substrate such that the gate electrode is interposed between the source and the drain, a first contact wiring line which is provided on the source, a second contact wiring line which is provided on the drain, a first piezoelectric layer which is provided to cover the gate electrode and has one end and the other end connected between the first and second contact wiring lines, and a second insulated-gate field-effect transistor of a second conductivity type, which is provided adjacent to the first insulated-gate field-effect transistor in a channel length direction.

According to still another aspect of the present invention, there is provided a method of manufacturing a semiconductor device, comprising, forming a gate electrode on a semiconductor substrate, doping impurities in the semiconductor substrate by using the gate electrode as a mask, thus forming a source and a drain; forming a piezoelectric layer over the source, the gate electrode and the drain; forming an interlayer insulation film on the piezoelectric layer, etching the interlayer insulation film and the piezoelectric layer until a surface of the source and a surface of the drain are exposed, thus forming a first trench and a second trench, and burying an electrically conductive material in the first and second trenches, thereby forming first and second wiring lines.

DETAILED DESCRIPTION OF THE INVENTION

Embodiments of the present invention will now be described with reference to the accompanying drawings. In the description below, common parts are denoted by like reference numerals throughout the drawings.

First Embodiment

Figure 1:
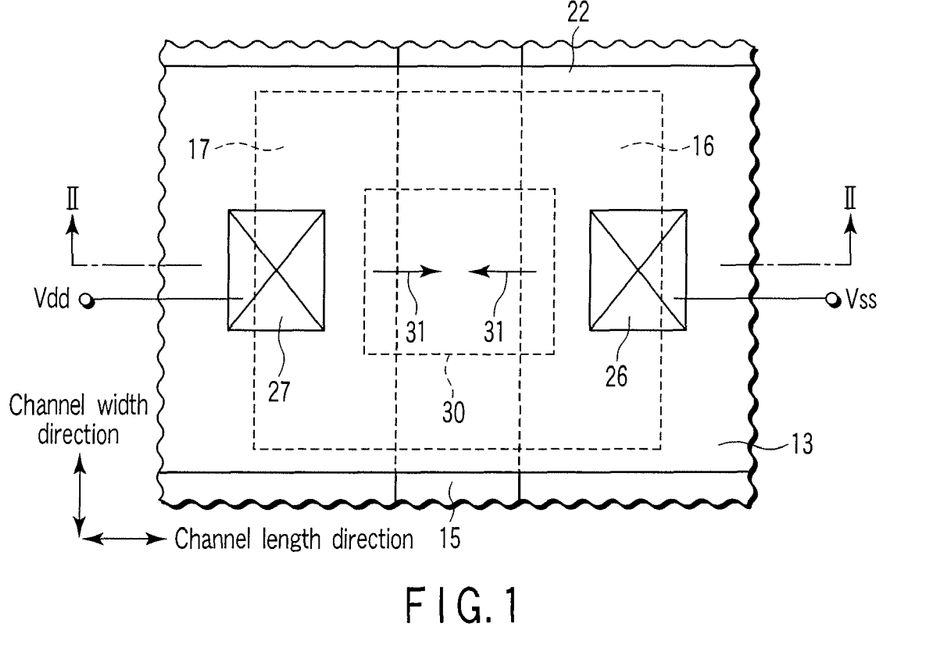
FIG. 1 is a plan view showing a semiconductor device according to a first embodiment of the present invention.
Figure 2:
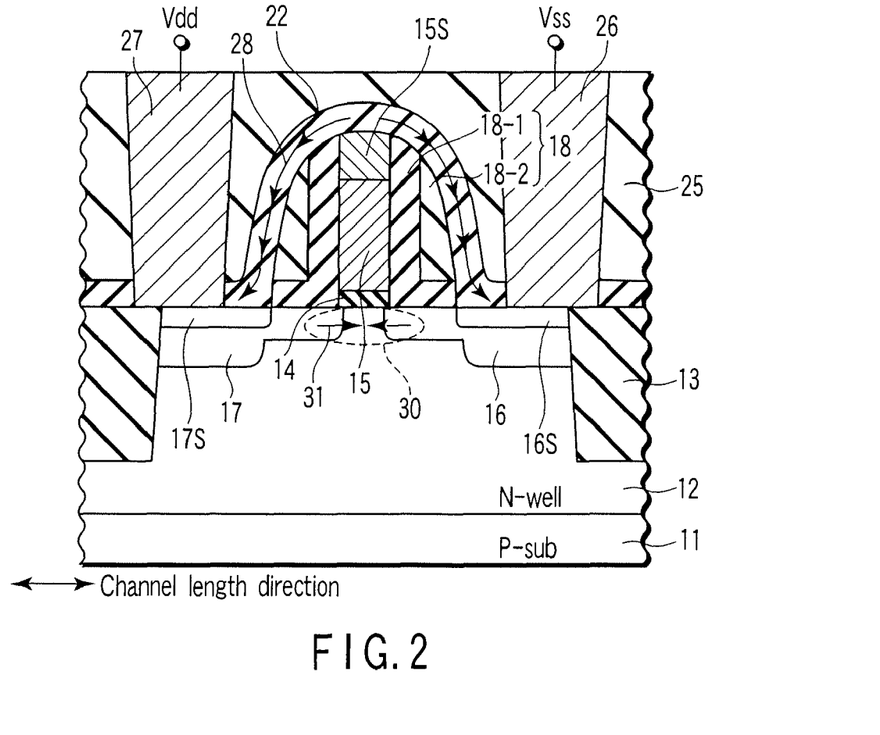
FIG. 2 is a cross-sectional view taken along line II-II in FIG. 1.

A semiconductor device according to a first embodiment of the present invention is described with reference to FIG. 1 and FIG. 2. FIG. 1 is a plan view that schematically shows a semiconductor device according to the first embodiment of the invention. FIG. 2 is a cross-sectional view taken along line II-II in FIG. 1.

As shown in FIGS. 1 and 2, a P-type MOS (metal oxide semiconductor) transistor (PMOS transistor) P1 is provided on an N-well 12 which is formed in a P-type semiconductor (e.g. silicon) substrate (P-sub) 11 that is isolated by a device isolation film 13.

The PMOS transistor P1 includes a gate insulation film 14, a gate electrode 15, a source 16, a drain 17, silicide layers 15S, 16S and 17S, and spacer insulation films 18-1 and 18-2.

The gate insulation film 14 is provided on the N-well 12. The gate electrode 15 is provided on the gate insulation film 14. The silicide layer 15S is provided on the gate electrode 15. The source 16 and drain 17 are provided spaced apart in the N-well 12 so as to sandwich the gate electrode 15. The silicide layer 16S is provided on the source 16, and the silicide layer 17S is provided on the drain 17. The spacer insulation film 18-1 is provided along side walls of the gate electrode 15, and the spacer insulation film 18-2 is provided on the spacer insulation film 18-1. The spacer insulation films 18-1 and 18-2 function as a spacer 18 of the transistor P1.

A piezoelectric layer 22 is provided so as to cover the gate electrode 15 and spacer 18. The piezoelectric layer 22 is formed of a piezomaterial which deforms, when an electric field is applied thereto, so as to extend in the direction of the electric field. In this example, the piezoelectric layer 22 is formed of a $BaTiO_3$ (barium titanate) layer.

An interlayer insulation film 25 is provided so as to cover the piezoelectric layer 22. A contact wiring line 26, which penetrates the interlayer insulation film 25 and piezoelectric layer 22 and is electrically connected to the source 16, is provided on the silicide layer 16S. A contact wiring line 27, which penetrates the interlayer insulation film 25 and piezoelectric layer 22 and is electrically connected to the drain 17, is provided on the silicide layer 17S.

<Driving Operation>

Figure 3:
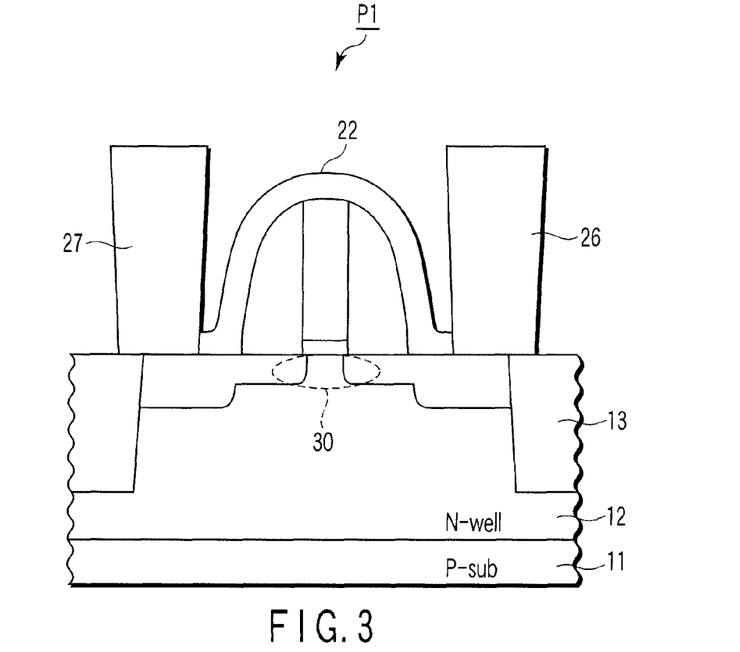
FIG. 3 is a cross-sectional view for explaining the driving operation of the semiconductor device according to the first embodiment.
Figure 4:
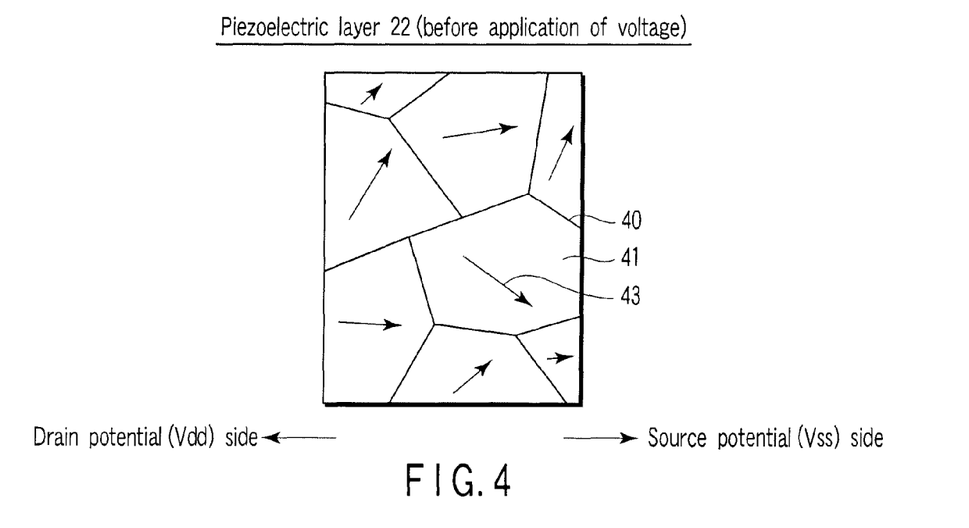
FIG. 4 is a plan view showing a piezoelectric layer in FIG. 3.
Figure 5:
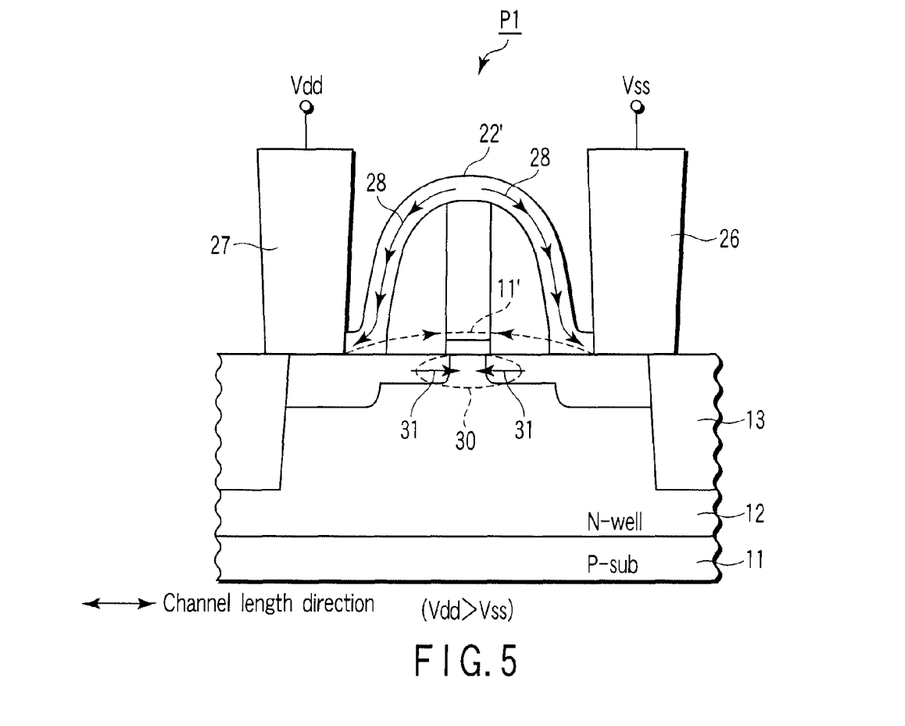
FIG. 5 is a cross-sectional view for explaining the driving operation of the semiconductor device according to the first embodiment.
Figure 6:
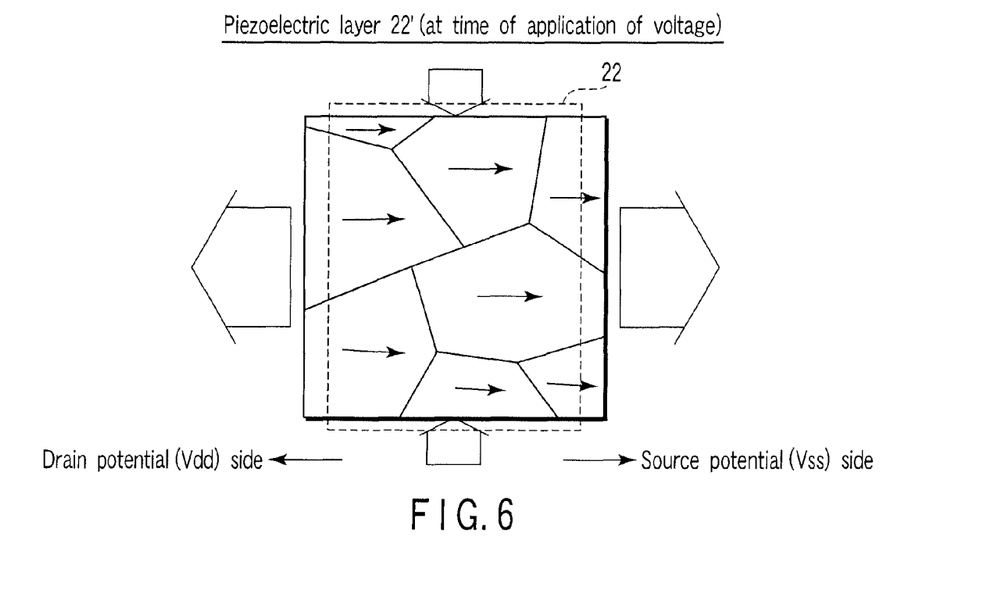
FIG. 6 is a plan view showing a piezoelectric layer in FIG. 5.

Next, the driving operation of the semiconductor device according to this embodiment is described with reference to FIG. 3 to FIG. 6. FIG. 3 and FIG. 5 are cross-sectional views for describing the driving operation of the semiconductor device of this embodiment. FIG. 4 is a plan view showing the piezoelectric layer 22 in FIG. 3, and FIG. 6 is a plan view showing the piezoelectric layer 22 in FIG. 5.

As shown in FIG. 3, before the PMOS transistor P1 is driven, no voltage is applied to the contact wiring lines 27 and 26. Thus, no voltage is applied to the piezoelectric layer ($BaTiO_3$ layer) 22, and no strain occurs in the piezoelectric layer 22. Accordingly, no stress occurs in a channel region 30 of the transistor P1.

In this case, as shown in FIG. 4, the piezoelectric layer 22 is formed of grains 41 which are divided by grain boundaries 40. The size of each grain 41 is, e.g. about several-ten to several-hundred nm. Each grain 41 is subjected to a poling process at a predetermined temperature with application of a DC current. Thus, the electric dipoles in the grain 41 are aligned, and the grain 41 has polarization 43. Thereby, even after the application of DC current is stopped, a dipole moment due to the polarization 43 remains in the piezoelectric layer 22, and the piezoelectric layer 22 has large piezoelectricity.

Subsequently, as shown in FIG. 5, when the PMOS transistor P1 is driven, a well potential is applied to the N-well 12, and a voltage with a voltage value Vss is applied as a source potential to the contact wiring line 26. Further, a voltage with a voltage value Vdd is applied as a drain potential to the contact wiring line 27. By the source voltage and drain voltage, an electric field is generated between the contact wiring lines 26 and 27 in the channel length direction.

In this case, as shown in FIG. 6, the electric dipoles are aligned in the direction of electric field. As a result, each grain 41 slightly extends in the direction of electric field. Accordingly, a strain 28 occurs in the piezoelectric layer 22' to which the electric field is applied, so that the piezoelectric layer 22' may extend in the direction of electric field (reverse piezoelectric effect). In this example, the value of strain 28 is, e.g. about several Gpa.

Then, due to the strain 28, the substrate 11 under the gate electrode tries to deform, as indicated by a broken line 11'. Consequently, a desired compressive stress 31 occurs in the channel region 30 of the PMOS transistor P1. In this state, a gate voltage is applied to the gate electrode 15 to form a channel, and holes (carriers) are let to flow through the channel to which the compressive stress 31 is applied. Thus, the transistor P1 is driven.

In the case where the $BaTiO_3$ layer is applied to the piezoelectric layer 22, as in the present example, the magnitude of the compressive stress 31 can be estimated as follows.

As is generally known, the Young's modulus of $BaTiO_3$ is about 67 Gpa, and the deformation ($\Delta L/L$) of $BaTiO_3$ is about 0.75% at maximum at an electric filed of 200 V/mm. Thus, the stress is Young's modulus×deformation=67 Gpa× 0.75%=about 0.5 Gpa.

The electric field between the source and drain of the transistor P1 is at least 1 V/100 nm=10000 V/mm, and is about 50 times higher than 200 V/mm. In addition, considering that the deformation of the piezomaterial of the piezoelectric layer 22 is proportional to the magnitude of electric field, it is estimated that the magnitude of compressive stress 31, which is generated in this example, is 0.5 Gpa×50=about 25 Gpa which is about 10 times of the stress produced by usual $Si_3N_4$ liner.

<Manufacturing Method>

Next, a manufacturing method of the semiconductor device according to the embodiment will now be described with reference to FIG. 7 to FIG. 9, taking the semiconductor device shown in FIG. 1 and FIG. 2 by way of example.

Figure 7:
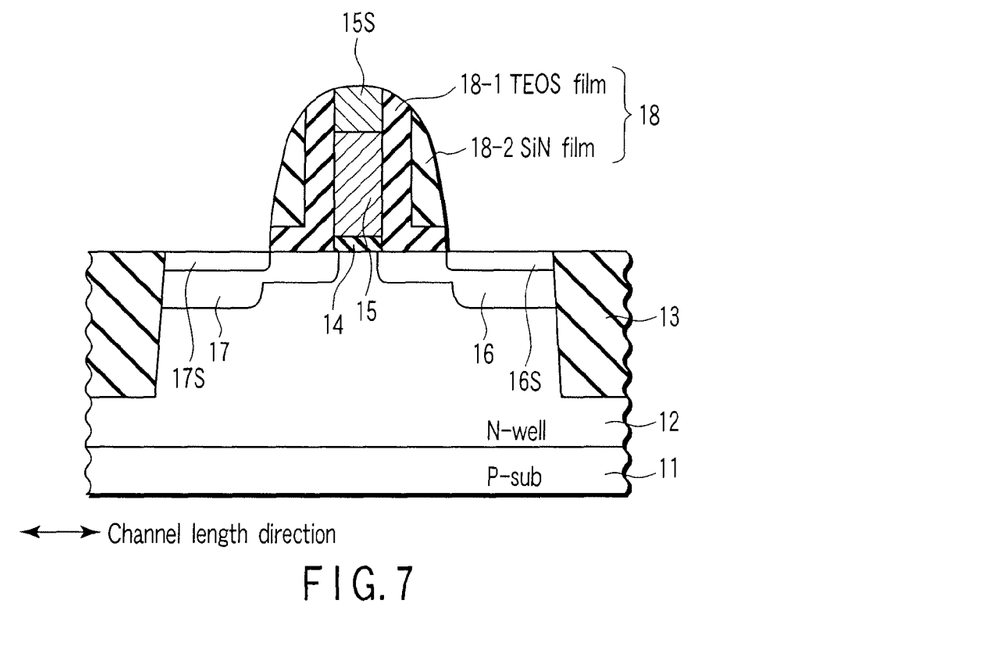
FIG. 7 is a cross-sectional view showing a fabrication step of the semiconductor device according to the first embodiment of the invention.

To begin with, as shown in FIG. 7, using a well-known fabrication step, an N-well region 12 is formed in a P-type silicon substrate 11, and device isolation films 13 are buried. Then, a gate insulation film 14 is formed on the substrate 11, and a gate electrode 15 is formed on the gate insulation film 14. Using the gate electrode 15 as a mask, P-type impurities, such as boron (B), are doped in the N-well 12. Subsequently, a TEOS film and a $Si_3N_4$ film are successively deposited by, e.g. CVD (chemical vapor deposition), and these films are subjected to anisotropic etching by, e.g. RIE (reactive ion etching). Thus, a spacer insulation film (TEOS film) 18-1 and a spacer insulation film ($Si_3N_4$ film) 18-2 are formed on side walls of the gate electrode 15. Using the gate electrode 15 and the spacer 18 as a mask, P-type impurities, such as boron (B), are doped in the N-well 12, and a source 16 and a drain 17 are formed. Silicide layers 15S, 16S and 17S are formed on the gate electrode 15, source 16 and drain 17 by using a salicide process.

Figure 8:
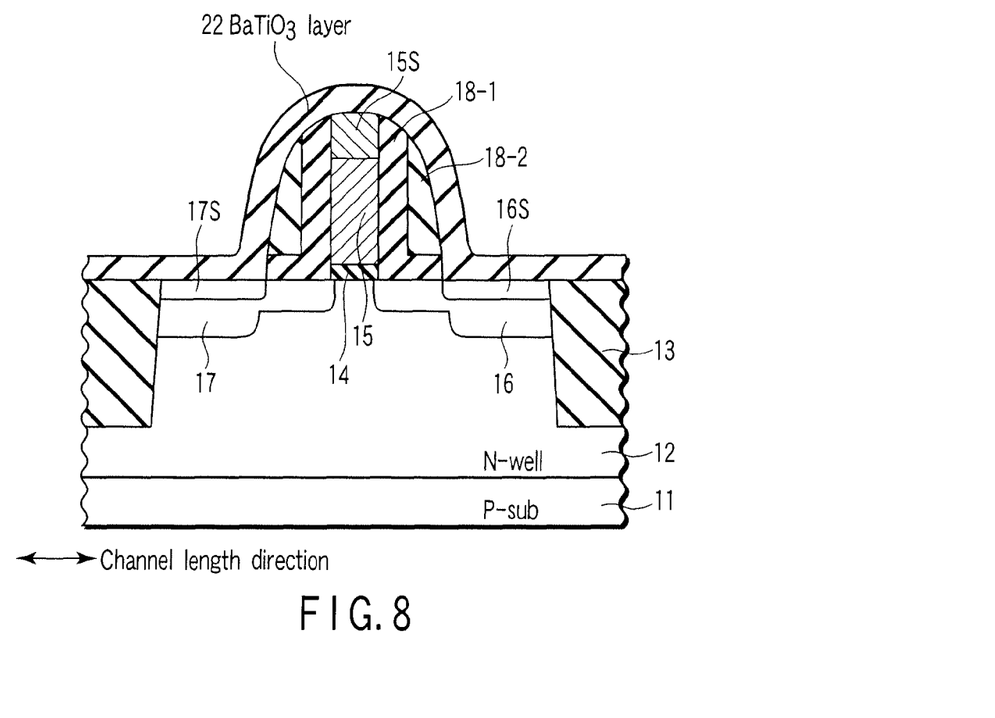
FIG. 8 is a cross-sectional view showing a fabrication step of the semiconductor device according to the first embodiment of the invention.

Next, a description is given of a step of forming a piezoelectric layer ($BaTiO_3$ layer) 22 on the above-described structure, as illustrated in FIG. 8. BaO powder and $TiO_2$ powder are mixed at a ratio of 1:1, and the mixed powder is sintered, for example for two hours at about 1,100° C. Further, the resultant is subjected to ball milling for 24 hours with use of ethanol solution, and mixed powder in which both components are uniformly mixed is obtained. The mixed powder is pressurized at, e.g. about 10 Mpa, and pellets are formed. The pellets are sintered, for example, at 1,350° C. for two hours.

Using the sintered body as a target, rf magnetic sputtering, for instance, is performed. Thereby, a $BaTiO_3$ layer is evaporation-deposited on the silicide layers 15S, 16S and 17S and the spacer 18, and thus a piezoelectric layer 22 is formed. For example, the sputtering process is performed at about 700° C. in an atmosphere of $Ar:O_2=4:1$ under a pressure of about 20 mTorr in the chamber.

Figure 9:
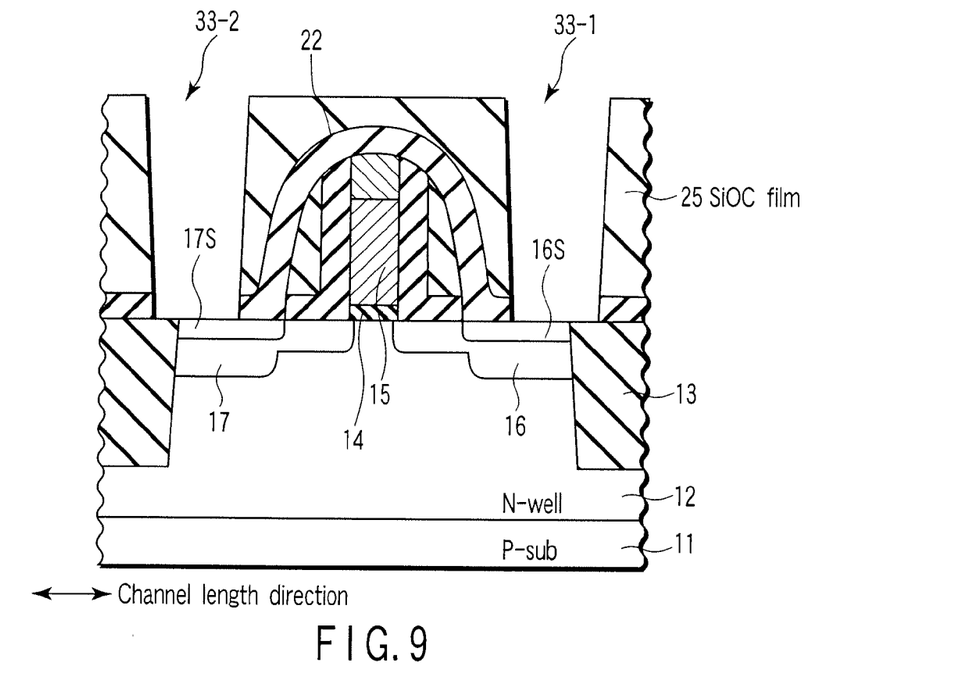
FIG. 9 is a cross-sectional view showing a fabrication step of the semiconductor device according to the first embodiment of the invention.

Subsequently, as shown in FIG. 9, an SiOC film is deposited on the piezoelectric layer 22 by, e.g. CVD, and thus an interlayer insulation film 25 is formed. Then, using anisotropic etching such as RIE, trenches 33-1 and 33-2 are formed by removing the interlayer insulation film 25 and piezoelectric layer 22 on the source 16 and drain 17.

In the trenches 33-1 and 33-2, Cu (copper), Al (aluminum) or polysilicon, for instance, is buried, and contract wiring lines 26 and 27 are formed (not shown). In the above-described fabrication process, it is preferable to perform a poling process for aligning polarization in the piezoelectric layer 22. Through the above-described fabrication steps, the semiconductor device shown in FIG. 1 and FIG. 2 is manufactured.

With the above-described semiconductor device and the manufacturing method according to the embodiment, the following advantageous effects (1) to (4) can be obtained.

(1) The controllability of stress can be improved.

As described above, the piezoelectric layer 22 is provided so as to cover the gate electrode 15 and spacer 18. The piezoelectric layer 22 is formed of a piezomaterial which deforms, when an electric field is applied thereto, so as to extend in the direction of the electric field. Thereby, in accordance with an electric field that occurs between the contact wiring lines 26 and 27 when the transistor P1 is driven, a strain 28 occurs in the piezoelectric layer 22 so that the piezoelectric layer 22 may deform and extend in the channel length direction (reverse piezoelectric effect).

Thus, a desired compressive stress 31 in the channel length direction can be applied to the channel region 30 of the transistor P1, and the mobility of holes can be improved.

Making use of the reverse piezoelectric effect, the compressive stress 31 can electrically be generated by the electric field acting between the contact wiring lines 26 and 27. The voltage, which is applied to the contact wiring lines 26 and 27, is supplied by the power supply voltages Vss and Vdd of the source voltage and drain voltage. Compared to the case of generating stress by making use of, e.g. film thickness, the value of the generated stress can be stabilized, without depending on the manufacturing process, etc.

Since the stress 31 is generated along the path of extension of the piezoelectric layer 22 that is provided between the contact wiring lines 26 and 27, the generation of stress can exactly be controlled in an "electric circuit" fashion, so to speak. Thus, the generation of the stress 31 can visually be confirmed, and even a complex stress can easily be controlled. In this respect, the present embodiment is advantageous for the control of complex stress engineering.

As described above, the stable stress 31 can easily be applied to the channel region 30, and the controllability of stress can be improved.

(2) The mobility of carriers can be improved.

Since the reverse piezoelectric effect is utilized, the magnitude of the compressive stress 31 depends on the Young's modulus of the piezomaterial of the piezoelectric layer 22 and the generated electric field. When the magnitude of the compressive stress 31 is to be increased, there are no restrictions, such as the film thickness as in the case of an $Si_3N_4$ film, or restrictions on the reliability as in the case of a strain Si substrate. As a result, the compressive stress 31 can be increased by selecting a piezomaterial with a high Young's modulus or by increasing the value of potential that is applied between the contact wiring lines 26 and 27. In this respect, the mobility of carriers can be improved.

(3) The mobility of carriers can be improved as the degree of microfabrication is increased.

With recent development of microfabrication of transistors, the gate length has become very short. On the other hand, the compressive stress 31 is applied by the electric field that occurs between the source and drain. It is known that the magnitude of this electric field increases as the gate length becomes shorter.

Since the compressive stress 31 can naturally be increased by the decrease in gate length due to microfabrication, the mobility of carriers can be improved as the degree of microfabrication progresses.

(4) The manufacturing cost can advantageously be reduced.

The compressive stress 31 can be generated by making use of the electric field that naturally occurs between the contact wiring lines 26 and 27 when the transistor P1 is driven. Thus, there is no need to provide special power supply terminals, etc. in order to generate the stress 31. Therefore, the manufacturing cost can advantageously be reduced.

Moreover, the piezoelectric layer 22 can be formed by only the fabrication step of evaporation-depositing, e.g. the $BaTiO_3$. Since the additional use of an excess mask is needless, the manufacturing cost can advantageously be reduced.

Second Embodiment (Example of Sol-gel Method)

Next, a semiconductor device according to a second embodiment of the invention is described with reference to FIG. 10 and FIG. 11. This embodiment relates to an example in which the piezoelectric layer 22, which has been described in the first embodiment, is fabricated by using a sol-gel method. A detailed description of the structure of the second embodiment is omitted since the structure is the same as that of the first embodiment.

Figure 10:
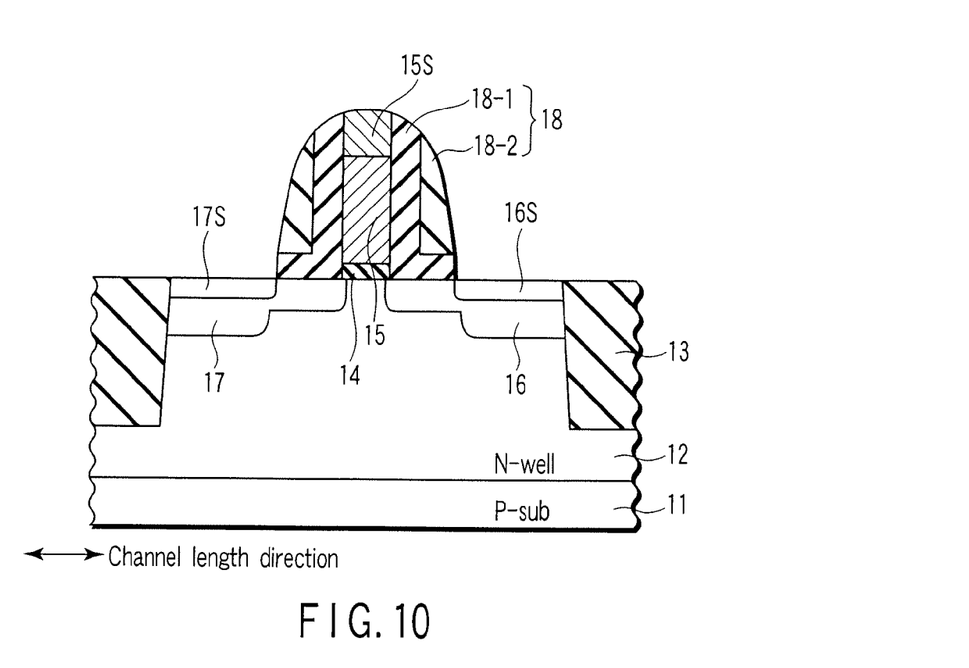
FIG. 10 is a cross-sectional view showing a fabrication step of a semiconductor device according to a second embodiment of the invention.

To begin with, as shown in FIG. 10, using the same fabrication step as in the first embodiment, the gate structure, spacer 18, source 16, drain 17 and silicide layers 15S, 16S and 17S are formed on the N-well 12.

Figure 11:
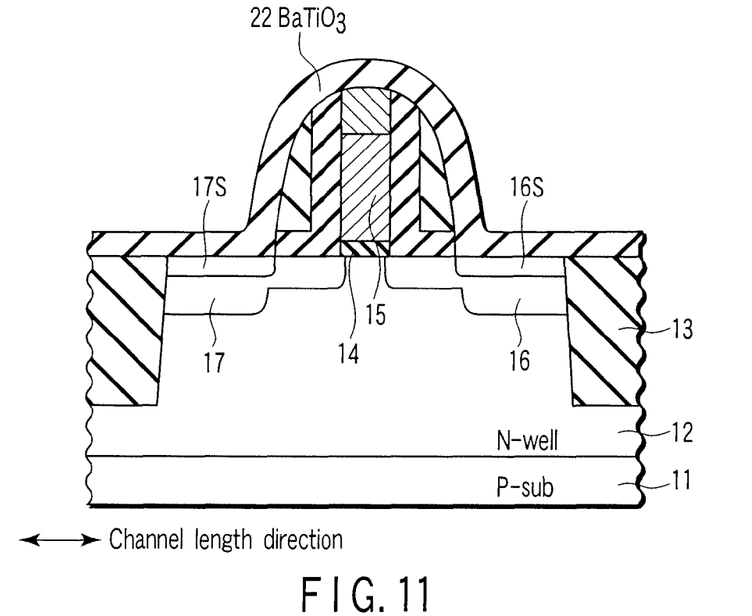
FIG. 11 is a cross-sectional view showing a fabrication step of the semiconductor device according to the second embodiment of the invention.

Referring to FIG. 11, a step of forming the piezoelectric layer ($BaTiO_3$ layer) 22 on the above-described structure is described. Barium acetate and titanium tetra n-butoxide are dissolved in methanol solution so that a mixing ratio of Ba/Ti may become 1:1. Using acetic acid as catalyst in this case, an organic reaction is caused to form a sol solution.

The sol solution is coated by, e.g. spin coating, on the silicide layers 15S, 16S and 17S and the spacer. The coated solution is annealed, for example, at about 700° C. for about 40 minutes. Thereby, a $BaTiO_3$ layer is formed, and thus the piezoelectric layer 22 is formed. With the thus fabricated $BaTiO_3$ layer, a stress of about 25 Gpa, which is about 10 times of the stress produced by usual $Si_3N_4$ liner, can be generated.

Subsequently, using the same fabrication process as in the first embodiment, the semiconductor device as shown in FIG. 1 and FIG. 2 is manufactured.

According to this structure and manufacturing method, the same advantageous effects as the above-described effects (1) to (4) can be obtained. Further, as in this embodiment, the piezoelectric layer ($BaTiO_3$ layer) 22 may be formed using the sol-gel method. The above-described method is applicable, as needed.

Third Embodiment (Example in which Stress is Applied to a Central Part of the Channel Region)

Figure 12:
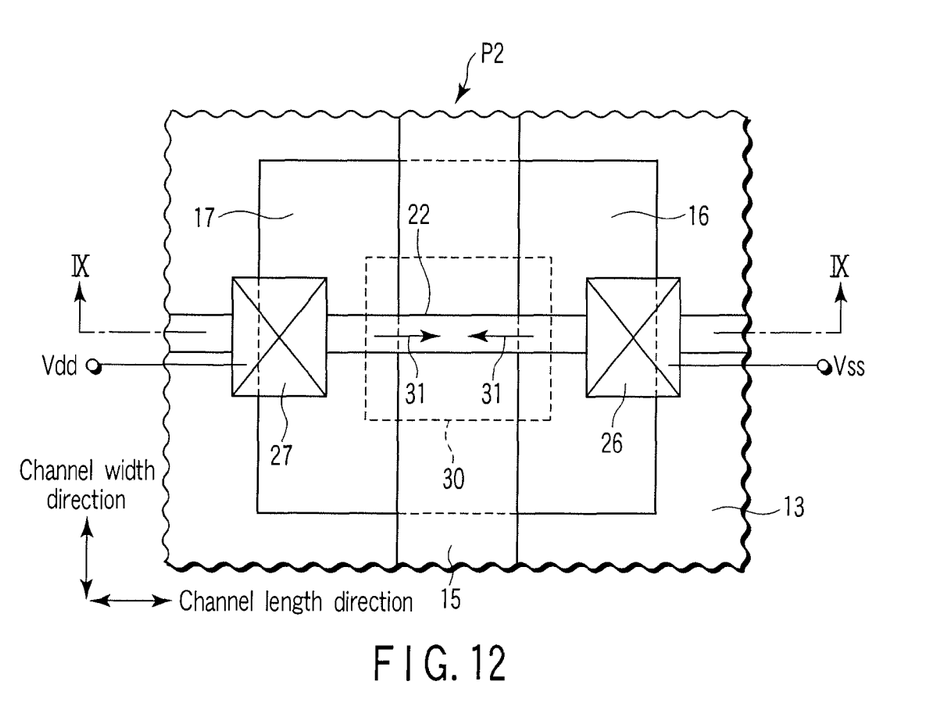
FIG. 12 is a plan view showing a semiconductor device according to a third embodiment of the invention.
Figure 13:
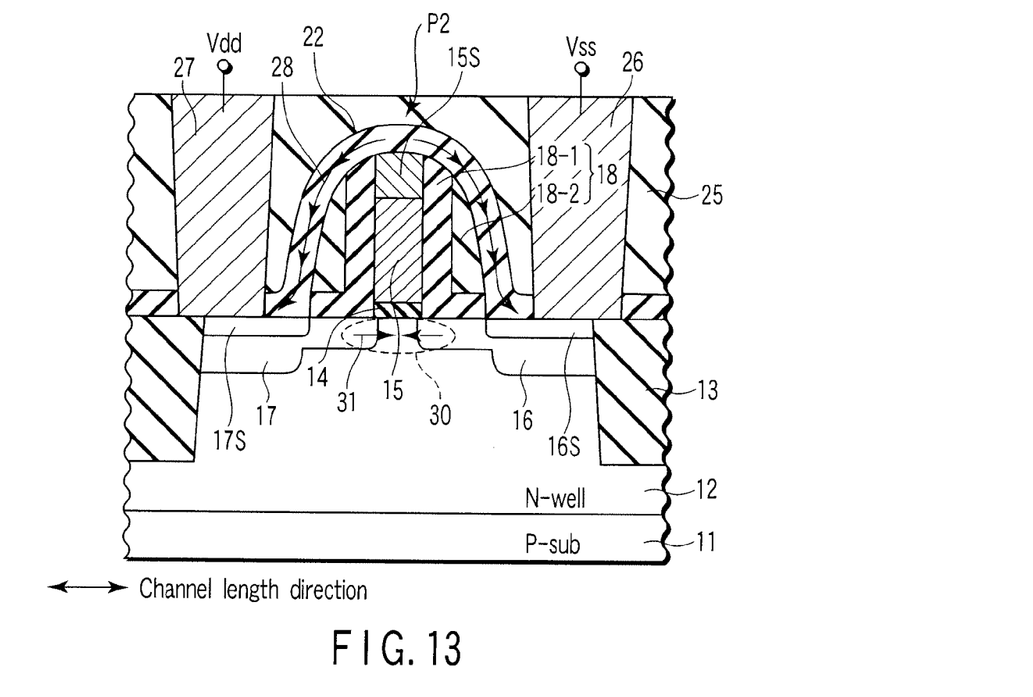
FIG. 13 is a cross-sectional view taken along line IX-IX in FIG. 12.

Next, a semiconductor device according to a third embodiment of the invention is described with reference to FIG. 12 and FIG. 13. FIG. 12 is a plan view showing the semiconductor device according to the third embodiment. FIG. 13 is a cross-sectional view taken along line IX-IX in FIG. 12. This embodiment relates to an example in which the piezoelectric layer 22, which has been described in the first embodiment, is formed on a central part of the channel region 30. A description of the parts common to those of the first embodiment is omitted here.

As shown in the Figures, a PMOS transistor P2 is provided on the N-well 12. The transistor P2 includes a piezoelectric layer ($BaTiO_3$ layer) 22 which is electrically connected to the contact wiring lines 26 and 27 and is so formed as to cover the gate electrode 15 and the spacer. This piezoelectric layer 22 differs from that of the first embodiment in that the piezoelectric layer 22 is provided only on the central part of the channel region 30.

<Driving Operation>

Next, the driving operation of the semiconductor device according to this embodiment is described. To begin with, a well potential is applied to the N-well 12, and a voltage with a voltage value Vss is applied as a source potential to the contact wiring line 26. Further, a voltage with a voltage value Vdd is applied as a drain potential to the contact wiring line 27. By the source voltage and drain voltage, an electric field is generated between the contact wiring lines 26 and 27 in the channel length direction.

In accordance with the electric field, the piezoelectric layer 22 deforms so as to extend in the channel length direction, and a strain 28 occurs in the piezoelectric layer 22. As a result, a desired compressive stress 31 occurs only in the central part of the channel region 30 of the PMOS transistor P2. In this state, a gate voltage is applied to the gate electrode 15 to form a channel, and holes (carriers) are let to flow through the channel to which the compressive stress 31 is applied. Thus, the transistor P2 is driven.

<Manufacturing Method>

Figure 14:
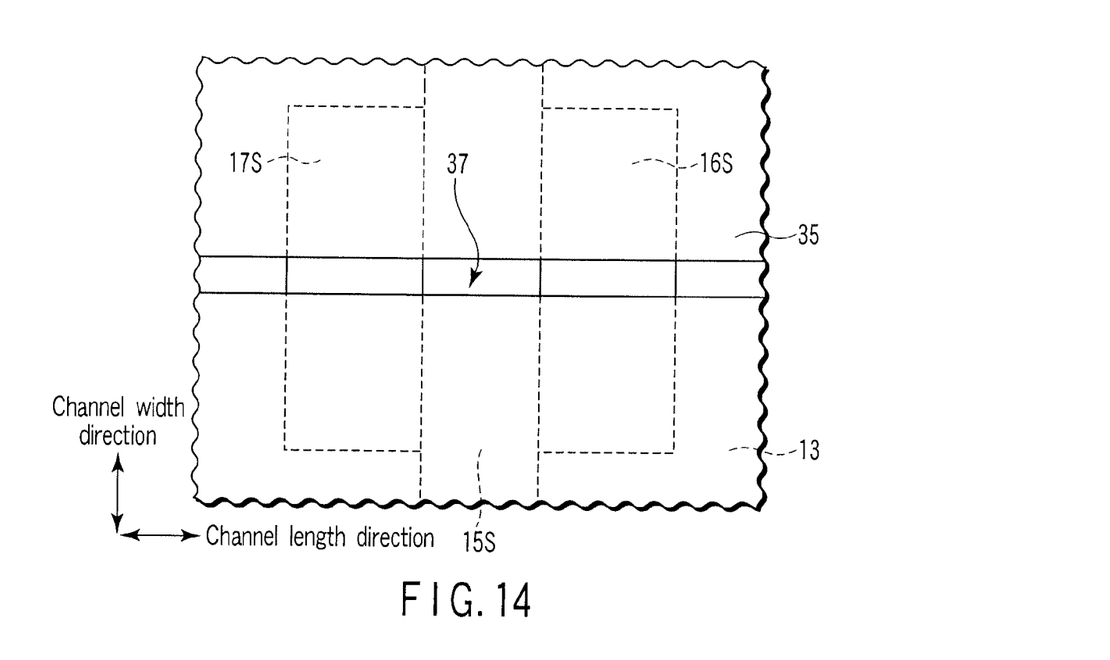
FIG. 14 is a plan view showing a fabrication step of the semiconductor device according to the third embodiment of the invention.
Figure 15:
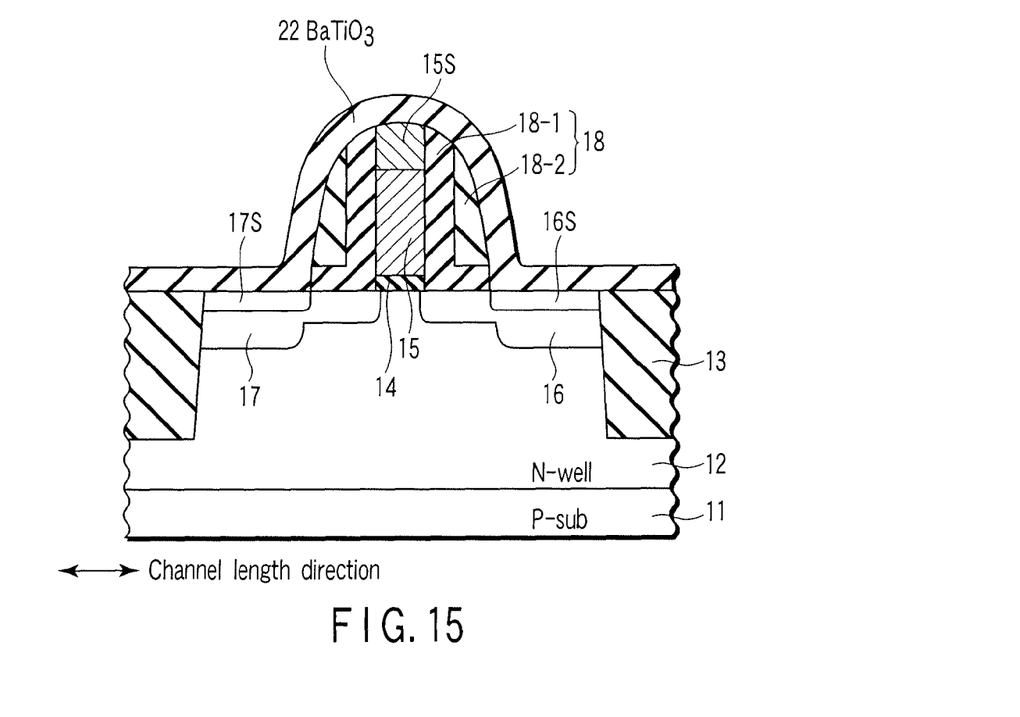
FIG. 15 is a cross-sectional view showing a fabrication step of the semiconductor device according to the third embodiment of the invention.

Next, a manufacturing method of the semiconductor device according to this embodiment will now be described with reference to FIG. 14 and FIG. 15. FIG. 14 is a plan view showing a fabrication step of the semiconductor device according to the third embodiment. FIG. 15 is a cross-sectional view, taken in the same direction as FIG. 13, showing a fabrication step of the semiconductor device according to the third embodiment.

To start with, using the same fabrication step as in the first embodiment, a gate insulation film 14 is formed on the N-well 12, and a gate electrode 15 is formed on the gate insulation film 14. A spacer insulation film (TEOS film) 18-1 and a spacer insulation film ($Si_3N_4$ film) 18-2 are formed on side walls of the gate electrode 15. Thus, a spacer 18 is formed. Using the gate electrode 15 and the spacer 18 as a mask, P-type impurities, such as boron (B), are doped in the N-well 12, and a source 16 and a drain 17 are formed. Silicide layers 15S, 16S and 17S are formed on the gate electrode 15, source 16 and drain 17 by using a salicide process.

Subsequently, as shown in FIG. 14, a photoresist 35 is coated on the entire surface of the resultant structure (i.e. on the silicide layers 15S, 16S and 17S, spacer 18 and device isolation film 13). The photoresist 35 is exposed and developed, thereby forming an opening 37 which exposes those parts of the silicide layers 15S, 16S and 17S and device isolation film 13, which correspond to the central part of the gate electrode 15 extending in the channel length direction.

As shown in FIG. 15, using the photoresist 35 as a mask, a $BaTiO_3$ layer is buried in the opening 37 by, e.g. CVD. Thus, a piezoelectric layer 22 is formed.

After the photoresist 35 is removed, the semiconductor device shown in FIG. 12 and FIG. 13 is manufactured by using substantially the same fabrication steps as in the first embodiment.

With the above-described semiconductor device and the manufacturing method according to this embodiment, the same advantageous effects as the above-described effects (1) to (4) can be obtained.

Further, in this embodiment, the piezoelectric layer 22 is provided only on the central part of the channel region 30 in the channel length direction so as to cover the gate electrode 15 and spacer 18. Thus, a desired compressive stress 31 can be generated only at the central part of the channel region 30 when the transistor P2 is driven.

As a result, the mobility of holes (carriers) can locally be enhanced at the central part of the gate electrode 15. In this manner, this structure is applicable, as needed.

[Modification 1 (Example in which Stress is Applied to the Channel Region)]

Figure 16:
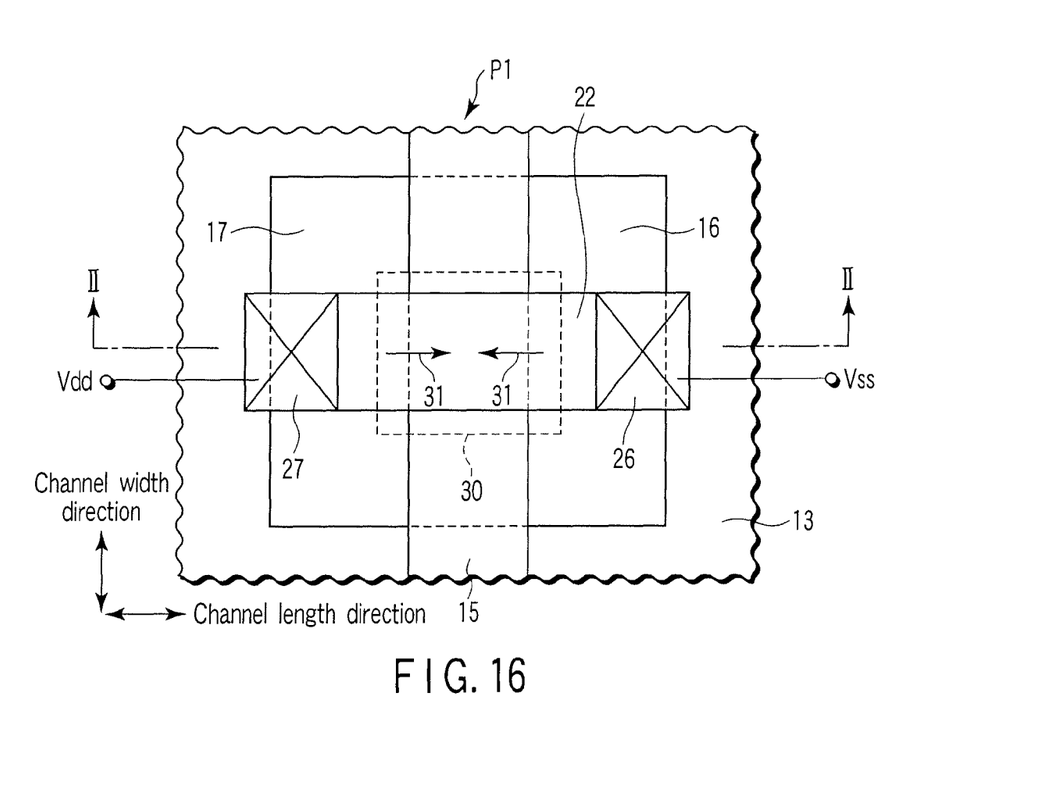
FIG. 16 is a plan view showing a semiconductor device according to Modification 1 of the invention.

Next, a semiconductor device according to Modification 1 of the invention is described with reference to FIG. 16. FIG. 16 is a plan view showing the semiconductor device according to Modification 1. Modification 1 relates to an example in which a compressive stress is applied to only the channel region. A description of the parts common to those of the third embodiment is omitted here.

As shown in the Figure, a PMOS transistor P1 is provided on the N-well 12. The transistor P1 includes a piezoelectric layer (BaTiO$_3$ layer) 22 which is electrically connected to the contact wiring lines 26 and 27 and is so formed as to cover the gate electrode 15 and the spacer 18.

Modification 1 differs from the third embodiment in that the piezoelectric layer 22 is provided only on the channel region 30 in the channel length direction. The manufacturing method of the semiconductor device differs from that of the third embodiment in that the opening 37, which is formed by exposing and developing the photoresist 35, is made wider.

According to the semiconductor device and the manufacturing method of Modification 1, the same advantageous effects as the above-described effects (1) to (4) can be obtained.

Further, in Modification 1, the piezoelectric layer 22 is provided only on the channel region 30. Thus, stress engineering for applying the compressive stress 31 to only the channel region 30 can be performed, as needed.

[Modification 2 (Example in which the Length of the Piezoelectric Layer is Increased)]

Figure 17:
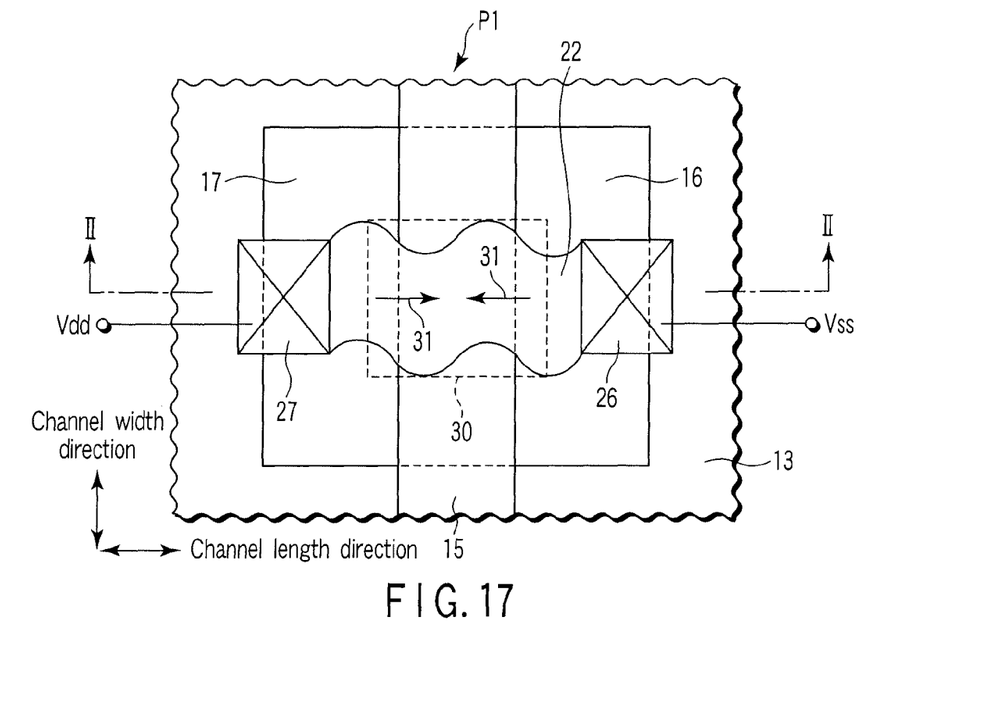
FIG. 17 is a plan view showing a semiconductor device according to Modification 2 of the invention.

Next, a semiconductor device according to Modification 2 of the invention is described with reference to FIG. 17. FIG. 17 is a plan view showing the semiconductor device according to Modification 2. Modification 2 relates to an example in which a greater compressive stress is applied. A description of the parts common to those of the third embodiment is omitted here.

As shown in the Figure, a PMOS transistor P1 is provided on the N-well 12. The transistor P1 includes a piezoelectric layer (BaTiO$_3$ layer) 22 which is electrically connected to the contact wiring lines 26 and 27 and is so formed as to cover the gate electrode 15 and the spacer 18.

Modification 2 differs from the third embodiment in that the piezoelectric layer 22 is provided on the channel region 30 in a meandering fashion in the channel length direction. The manufacturing method of the semiconductor device differs from that of the third embodiment in that the opening 37, which is formed by exposing and developing the photoresist 35, is made in a meandering fashion.

According to the semiconductor device and the manufacturing method of Modification 2, the same advantageous effects as the above-described effects (1) to (4) can be obtained.

Further, in Modification 2, the piezoelectric layer 22 is provided on the channel region 30 in a meandering fashion. Thus, the length of the piezoelectric layer is increased, and thereby the magnitude of the produced stress 31 can be increased. Therefore, stress engineering, which can increase the compressive stress 31, can be performed, as needed.

[Modification 3 (Example in which a Plurality of Piezoelectric Layers are Provided)]

Figure 18:
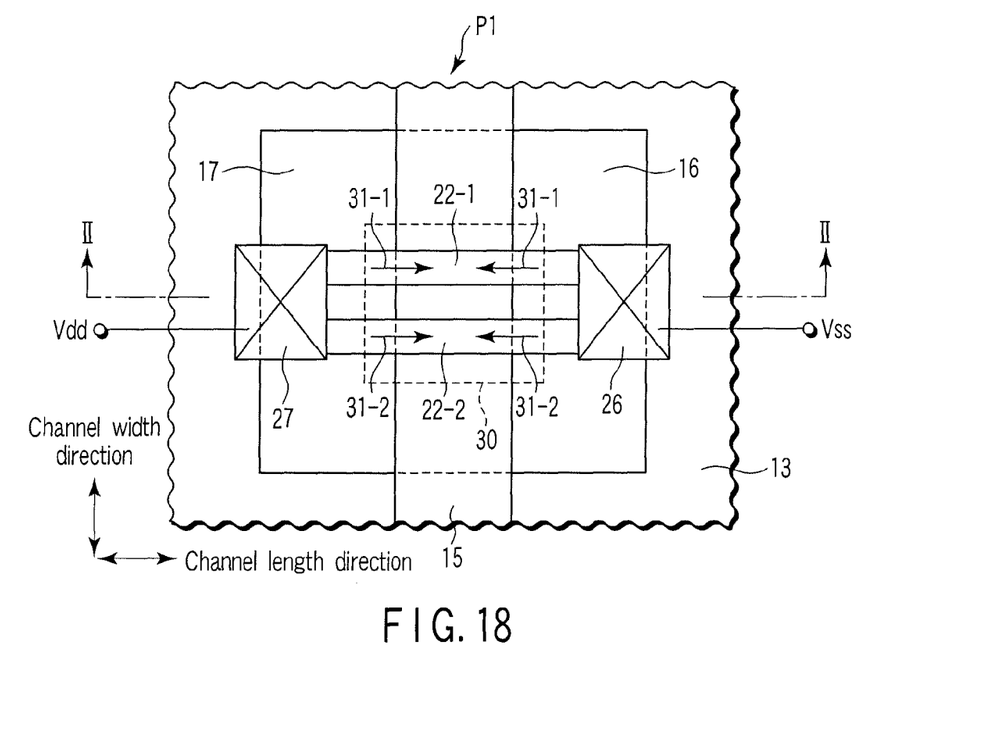
FIG. 18 is a plan view showing a semiconductor device according to Modification 3 of the invention.

Next, a semiconductor device according to Modification 3 of the invention is described with reference to FIG. 18. FIG. 18 is a plan view showing the semiconductor device according to Modification 3. Modification 3 relates to an example in which a plurality of compressive stresses are applied. A description of the parts common to those of the third embodiment is omitted here.

As shown in the Figure, a PMOS transistor P1 is provided on the N-well 12. The transistor P1 includes piezoelectric layers (BaTiO$_3$ layers) 22-1 and 22-2 which are electrically connected to the contact wiring lines 26 and 27 and are so formed as to cover the gate electrode 15 and the spacer 18.

Modification 3 differs from the third embodiment in that the two piezoelectric layers 22-1 and 22-2 are provided on the channel region 30 in the channel length direction. The manufacturing method of the semiconductor device differs from that of the third embodiment in that two openings 37, which are formed by exposing and developing the photoresist 35, are made.

According to the semiconductor device and the manufacturing method of Modification 3, the same advantageous effects as the above-described effects (1) to (4) can be obtained.

Further, in Modification 3, the two piezoelectric layers 22-1 and 22-2 are provided on the channel region 30 in the channel length direction. Thus, two strains can be generated, and two compressive stresses 31-1 and 31-2 can be generated at the same time. As a result, stress engineering, which can more finely generate stresses 31-1 and 31-2, can be performed, as needed.

The positions and shapes of the piezoelectric layers 22 are not limited to Modifications 1 to 3. For example, the piezoelectric layer 22 may be formed on a peripheral part of the gate electrode 15, or a plurality of piezoelectric layers 22 may be provided. Even in such cases, it should suffice if the layout pattern for exposing and developing the photoresist 35 is altered. Thus, since the number of fabrication steps does not increase, the manufacturing cost can advantageously be reduced.

Fourth Embodiment (Example in which the Mobility of Holes and the Mobility of Electrons are Improved at the Same Time)

Figure 19:
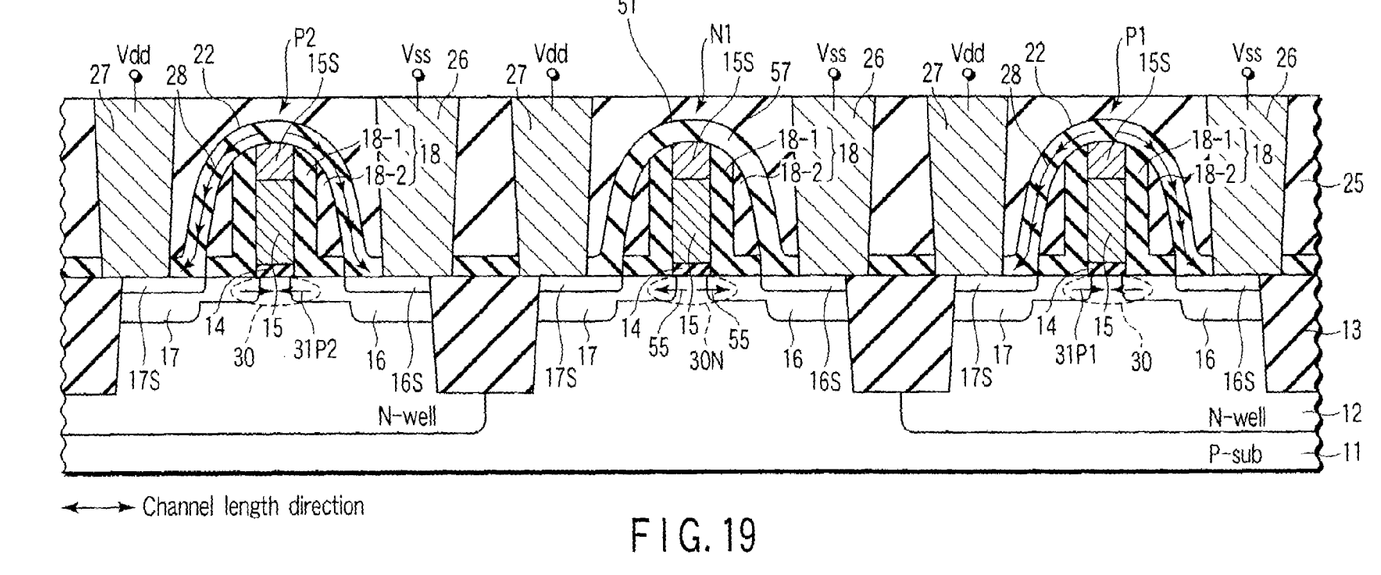
FIG. 19 is a cross-sectional view showing a semiconductor device according to a fourth embodiment of the invention.

Next, a semiconductor device according to a fourth embodiment of the invention is described with reference to FIG. 19. FIG. 19 is a cross-sectional view that schematically shows the semiconductor device according to the fourth embodiment. This embodiment relates to an example in which the mobility of holes and the mobility of electrons are improved at the same time. A description of the parts common to those of the first embodiment is omitted here.

As shown in the Figure, the semiconductor device according to the fourth embodiment differs from that of the first embodiment in the following respects. An NMOS transistor N1, which is an N-type MOS transistor, is provided on the P-type semiconductor (e.g. silicon) substrate (P-sub) 11. Further, PMOS transistors P1 and P2 are provided adjacent to the NMOS transistor N1 in the channel direction.

Each of the PMOS transistors P1 and P2 includes a piezoelectric layer 22 which is provided so as to cover the gate electrode 15 and spacer 18. The piezoelectric layer 22 is formed of a piezomaterial which deforms, when an electric field is applied thereto, so as to extend in the direction of the electric field. In this example, the piezoelectric layer 22 is formed of a BaTiO$_3$ (barium titanate) layer.

The NMOS transistor N1 includes a liner insulation film 51 which provided so as to cover the gate electrode 15 and spacer 18. The liner insulation film 51 is formed of an insulating material which is ordinarily used as a liner material. In this example, the liner insulation film 51 is formed of a silicon nitride (Si$_3$N$_4$) film, for instance.

<Driving Operation>

Next, the driving operation of the semiconductor device according to this embodiment is described.

To begin with, when the PMOS transistors P1 and P2 are driven, a voltage with a voltage value Vss is applied as a source potential to the contact wiring line 26, and a voltage with a voltage value Vdd is applied as a drain potential to the contact wiring line 27. By the source voltage and drain voltage, an electric field is generated between the contact wiring lines 26 and 27 in the channel length direction.

Then, as described above, the strain 28 occurs in the piezoelectric layer 22 so that the piezoelectric layer 22 may deform and extend in the direction of electric field (reverse piezoelectric effect).

By the strain 28, desired compressive stresses 31P1 and 31P2 are caused in the channel regions 30 of the PMOS transistors P1 and P2.

In this case, the NMOS transistor N1 is so disposed as to be sandwiched between the PMOS transistors P1 and P2 in the channel length direction. Thus, tensile stresses 55 are generated simultaneously and symmetrically in the channel region 30N of the transistor N1 by the compressive stresses 31P1 and 31P2.

In this state, gate voltages are applied to the gate electrodes 15 to form channels, and holes and electrons (carriers) are let to flow through the channels to which the compressive stresses 31P1 and 31P2 and tensile stress 55 are applied. Thus, the transistors P1, P2 and N1 are driven.

The manufacturing method of this semiconductor device is substantially the same as that of the first embodiment, so a detailed description of the method is omitted.

According to the semiconductor device and the manufacturing method of this embodiment, the same advantageous effects as the above-described effects (1) to (4) can be obtained.

Further, in this embodiment, the NMOS transistor N1 is so disposed as to be sandwiched between the PMOS transistors P1 and P2 in the channel length direction.

By making use of the compressive stresses 31P1 and 31P2 which are caused by the reverse piezoelectric effect when the PMOS transistors P1 and P2 are driven, the tensile stresses 55 can be applied simultaneously and symmetrically to the channel region 30N of the transistor N1. In this state, gate voltages are applied to the gate electrodes 15 to form channels, and holes and electrons (carriers) are let to flow through the channels to which the compressive stresses 31P1 and 31P2 and tensile stress 55 are applied. Thereby, the transistors P1, P2 and N1 are driven. Therefore, the mobility of holes and the mobility of electrons can advantageously be enhanced at the same time.

Furthermore, the tensile stress 55, which occurs in the channel region 30N of the NMOS transistor N1, is produced by making use of the compressive stresses 31P1 and 31P2 which are simultaneously and symmetrically generated. Thus, even in the case of using the ordinary liner insulation film 51, a high tensile stress 55 can be applied, and the mobility of electrons can advantageously be enhanced.

On the other hand, the NMOS transistor N1 can substantially be fabricated by well-known fabrication steps, and no special fabrication step is needed. Therefore, the manufacturing cost can advantageously be reduced.

[Modification 4 (Example in which a Liner Insulation Film Having a Negative Expansion Coefficient is Applied)]

Figure 20:
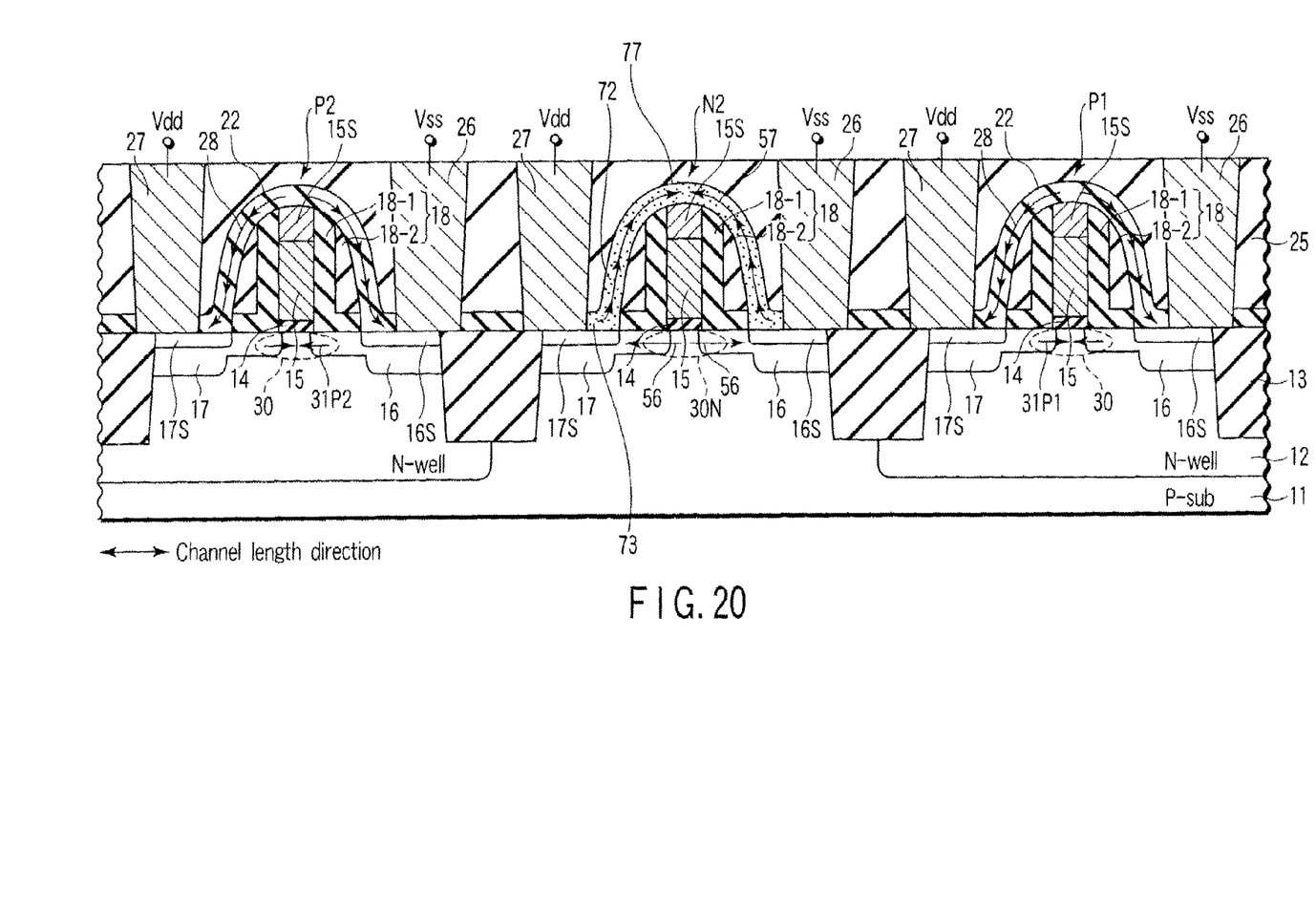
FIG. 20 is a cross-sectional view showing a semiconductor device according to Modification 4 of the invention.

Next, a semiconductor device according to Modification 4 of the invention is described with reference to FIG. 20. FIG. 20 is a cross-sectional view that schematically shows the semiconductor device according to Modification 4. Modification 4 relates to an example in which a liner insulation film with a negative expansion coefficient is applied to the NMOS transistor N1. A description of the parts common to those of the fourth embodiment is omitted here.

As shown in the Figure, the semiconductor device according to Modification 4 differs from that of the fourth embodiment in that an NMOS transistor N2 includes a pyroceramics layer 77 with a negative expansion coefficient, which is provided so as to cover the gate electrode 15 and spacer 18.

The pyroceramics layer 77 is a piezoelectric layer including an amorphous matrix layer 73 and crystal lines 72 which are dispersed in the amorphous matrix layer 73. The amorphous matrix layer 73 is formed of, e.g. $SiO_2$. The crystal lines 72 are formed of, e.g. $LiAlSiO_4$, and the size of each crystal line 72 is about several to several-ten nm.

The pyroceramics layer 77 has a negative expansion coefficient (negative rate of expansion) $[\Delta V/V/\Delta T]$ (V: volume, T: temperature, $\Delta V$: volume variation) The negative expansion coefficient, in this context, refers to a rate of decrease in volume in accordance with rising in temperature. The expansion coefficient of the pyroceramics layer 77 is, e.g. about $-8 \times 10^{-6}$/K. The crystalline 72 has a negative expansion coefficient, and the amorphous matrix layer 73 has a positive expansion coefficient. It is thus desirable that the volume ratio of the crystallines 72 to the entire pyroceramics layer 77 be higher than the ratio of the amorphous matrix layer 73 to the entire pyroceramics layer 77.

<Driving Operation>

Next, the operation of the semiconductor device according to Modification 4 is described.

As described above, when the transistors P1 and P2 are driven, a voltage with a voltage value Vss is applied as a source potential to the contact wiring line 26, and a voltage with a voltage value Vdd is applied as a drain potential to the contact wiring line 27. The tensile stress 55 can be caused in the channel region 30N by making use of the compressive stresses 31P1 and 31P2 which are caused by the reverse piezoelectric effect of the piezoelectric layer 22.

In addition, if a potential is applied to the gate electrodes 15 and electric current is let to flow through the channels, the transistors P1, P2 and N1 produce heat by the current flowing through the channels.

When the produced heat is conducted to the pyroceramics layer 77, the pyroceramics layer 77 contracts due to its own negative expansion coefficient. As a result, a strain 57 occurs in the pyroceramics layer 77 from the source/drain 16, 17 toward the silicide layer 15S.

Thus, in addition to the tensile stress 55 caused by the compressive stresses 31P1 and 31P2, a tensile stress occurs when the pyroceramics layer 77 contracts due to its own negative expansion coefficient. As a result, a compound tensile stress 56 is applied to the channel region 30N in the channel length direction. The magnitude of the compound tensile stress 56 is, e.g. about 80 to 100 Gpa.

As described above, a greater tensile stress is applied to the channel region 30N in the channel length direction.

Needless to say, the same operation can be achieved by not only the heat production due to the operation voltage of the transistors P1, P2 and N1, but also by the heat production which occurs when the LSI including the transistors P1, P2 and N1 is operated.

With the above-described semiconductor device according to Modification 4, the same advantageous effects as the above-described effects (1) to (4) can be obtained.

Further, the semiconductor device according to Modification 4 includes, as the liner insulation film, the pyroceramics layer 77 having the negative expansion coefficient.

Thus, the tensile stress, which occurs due to the stain 57 when the pyroceramics layer 77 contracts due to its own negative expansion coefficient, can be applied in addition to the tensile stress that is caused by the compressive stresses 31P1 and 31P2 when the PMOS transistors P1 and P2 are driven.

Since the great tensile stress 56 can be applied to the channel region 30N of the NMOS transistor N1, the mobility of electrons can very advantageously be enhanced.

The PMOS transistors P1 and P2 are so disposed as to sandwich the NMOS transistor N1 in the channel length direction. Thus, the compressive stresses 31P1 and 31P2 of the PMOS transistors P1 and P2 are increased by the compound tensile stress 56, and the mobility of holes can advantageously be improved.

According to the semiconductor device of Modification 4, even if the temperature of the substrate 11, etc. rises to a high level, the mobility of electrons of the NMOS transistor N1 can be increased. Moreover, as the temperature rises, the tensile stress 56 increases. Accordingly, the effect of the increase in mobility of electrons is more conspicuous as the temperature rises. Since the tensile stress 56 increases in accordance with the rise in temperature, the compressive stresses 31P1 and 31P2 also increase in accordance with the rise in temperature and the effect of the increase in mobility of holes becomes more conspicuous. In the structure of this Modification, both the mobility of holes and the mobility of electrons can advantageously be enhanced in accordance with the rise in temperature.

Even in a case where the temperature of, for example, an LSI including the transistors N1, P1 and P2 rises to a high level (e.g. about 200° C.) and a greater degree of thermal disturbance of silicon, etc. occurs, it becomes possible to prevent a decrease in mobility of carriers (electrons and holes). The degradation in characteristics of transistors can advantageously be prevented in a high-temperature condition of an LSI, etc. due to microfabrication of transistors in recent years.

In the above-described embodiments, barium titanate (BaTiO$_3$) is exemplified as the piezomaterial which applies compressive stress. However, the same advantageous effects can be obtained by using other piezomaterials such as ZnO, lead zirconate titanate (PZT: Pb(Zr, Ti)O$_3$), lithium niobate (LiNbO$_3$), lithium tantalate (LiTaO$_3$), lithium tetraborate (Li$_2$B$_4$O$_7$), and Langasite (La$_3$Ga$_5$SiO$_{14}$).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    an insulated-gate field-effect transistor including a gate insulation film provided on a major surface of a semiconductor substrate, a gate electrode provided on the gate insulation film, and a source and a drain provided spaced apart in the semiconductor substrate such that the gate electrode is interposed between the source and the drain;
    a first contact wiring line which is provided on the source;
    a second contact wiring line which is provided on the drain; and
    a piezoelectric layer which is provided to cover the gate electrode and has one end and the other end connected between the first and second contact wiring lines.

2. The device according to claim 1, wherein the piezoelectric layer comprises a plurality of grains which are divided by grain boundaries, each grain having polarization aligned in a predetermined direction.

3. The device according to claim 1, wherein the piezoelectric layer is provided on a central part of the gate electrode, which corresponds to a channel region in a channel length direction.

4. The device according to claim 1, wherein the piezoelectric layer is provided in a meandering fashion on the gate electrode, which corresponds to a channel region in a channel length direction.

5. The device according to claim 1, wherein a plurality of said piezoelectric layers are provided on the gate electrode, which corresponds to a channel region in a channel length direction.

6. The device according to claim 1, wherein the piezoelectric layer deforms in such a manner as to extend according to an electric field which occurs between the first and second contact wiring lines when the insulated-gate field-effect transistor is driven, thereby applying a compressive stress to a channel region.

7. The device according to claim 1, wherein the insulated-gate field-effect transistor is a P-type MOS transistor.

8. The device according to claim 1, wherein the piezoelectric layer includes one of BaTiO$_3$, ZnO, PZT, LiNbO$_3$, LiTaO$_3$, Li$_2$B$_4$O$_7$, and La$_3$Ga$_5$SiO$_{14}$.

9. A semiconductor device comprising:
    a first insulated-gate field-effect transistor of a first conductivity type including a gate insulation film provided on a major surface of a semiconductor substrate, a gate electrode provided on the gate insulation film, and a source and a drain provided spaced apart in the semiconductor substrate such that the gate electrode is interposed between the source and the drain;
    a first contact wiring line which is provided on the source;
    a second contact wiring line which is provided on the drain;
    a first piezoelectric layer which is provided to cover the gate electrode and has one end and the other end connected between the first and second contact wiring lines; and
    a second insulated-gate field-effect transistor of a second conductivity type, which is provided adjacent to the first insulated-gate field-effect transistor in a channel length direction.

10. The device according to claim 9, further comprising:
    a third insulated-gate field-effect transistor of the first conductivity type including a gate insulation film provided on the major surface of the semiconductor substrate, a gate electrode provided on the gate insulation film, and a source and a drain provided spaced apart in the semiconductor substrate such that the gate electrode is interposed between the source and the drain, the third insulated-gate field-effect transistor being disposed such that the second insulated-gate field-effect transistor is interposed between the first insulated-gate field-effect transistor and the third insulated-gate field-effect transistor;
    a third contact wiring line which is provided on the source;
    a fourth contact wiring line which is provided on the drain; and
    a second piezoelectric layer which is provided to cover the gate electrode and has one end and the other end connected between the third and fourth contact wiring lines.

11. The device according to claim 9, further comprising:
    a liner insulation film which is provided to cover the gate electrode of the second insulated-gate field-effect transistor.

12. The device according to claim 9, wherein the first piezoelectric layer deforms in such a manner as to extend according to an electric field which occurs between the first and second contact wiring lines when the first insulated-gate field-effect transistor is driven, thereby applying a compressive stress to a channel region of the first insulated-gate field-effect transistor and applying at the same time a tensile stress to one side of a channel region of the second insulated-gate field-effect transistor.

13. The device according to claim 9, wherein the second piezoelectric layer deforms in such a manner as to extend according to an electric field which occurs between the third and fourth contact wiring lines when the third insulated-gate field-effect transistor is driven, thereby applying a compressive stress to a channel region of the third insulated-gate field-effect transistor and applying at the same time a tensile stress to the other side of the channel region of the second insulated-gate field-effect transistor.

14. The device according to claim 9, further comprising:
an insulation layer with a negative expansion coefficient, which is provided to cover the gate electrode of the second insulated-gate field-effect transistor.

15. The device according to claim 14, wherein the insulation layer with the negative expansion coefficient is a pyroceramics layer including an amorphous matrix layer and crystallines which are dispersed in the amorphous matrix layer.

16. The device according to claim 14, wherein the insulation layer with the negative expansion coefficient contracts due to the negative expansion coefficient thereof, and applies a tensile stress to a channel region of the second insulated-gate field-effect transistor.

17. The device according to claim 10, wherein the first insulated-gate field-effect transistor is a P-type MOS transistor, the second insulated-gate field-effect transistor is an N-type MOS transistor, and the third insulated-gate field-effect transistor is a P-type MOS transistor.

* * * * *